US009848507B2

(12) United States Patent
Ahn (10) Patent No.: US 9,848,507 B2
(45) Date of Patent: Dec. 19, 2017

(54) HEAT DISSIPATION MODULE ASSEMBLY AND SET-TOP BOX HAVING THE SAME

(71) Applicant: HUMAX CO., LTD., Yongin (KR)

(72) Inventor: Jae Mo Ahn, Yongin (KR)

(73) Assignee: HUMAX CO., LTD., Yongin (KR)

( * ) Notice: Subject to any disclaimer, the term of this patent is extended or adjusted under 35 U.S.C. 154(b) by 0 days.

(21) Appl. No.: 15/474,925

(22) Filed: Mar. 30, 2017

(65) Prior Publication Data

US 2017/0295666 A1    Oct. 12, 2017

(30) Foreign Application Priority Data

Apr. 6, 2016 (KR) .................. 10-2016-0042384

(51) Int. Cl.
*H05K 7/20* (2006.01)
*H01L 23/367* (2006.01)
*H01L 23/467* (2006.01)

(52) U.S. Cl.
CPC ....... *H05K 7/20127* (2013.01); *H01L 23/367* (2013.01); *H05K 7/2039* (2013.01); *H01L 23/467* (2013.01)

(58) Field of Classification Search
CPC .............. H05K 7/20154; H05K 7/2039; H01L 23/46–23/467
See application file for complete search history.

(56) References Cited

U.S. PATENT DOCUMENTS

| 3,592,260 | A  | * | 7/1971  | Berger    | F28F 13/06      |
|-----------|----|---|---------|-----------|-----------------|
|           |    |   |         |           | 165/121         |
| 4,237,521 | A  | * | 12/1980 | Denker    | H05K 7/20909    |
|           |    |   |         |           | 165/122         |
| 5,150,278 | A  | * | 9/1992  | Lynes     | H05K 7/1015     |
|           |    |   |         |           | 165/80.3        |
| 5,513,071 | A  | * | 4/1996  | LaViolette| H05K 7/20545    |
|           |    |   |         |           | 165/80.3        |
| 6,533,028 | B2 | * | 3/2003  | Sato      | H01L 23/3677    |
|           |    |   |         |           | 165/185         |
| 6,668,910 | B2 | * | 12/2003 | Gawve     | H01L 23/3672    |
|           |    |   |         |           | 165/121         |
| 7,180,740 | B2 | * | 2/2007  | Li        | H01L 23/467     |
|           |    |   |         |           | 165/80.3        |
| 7,248,477 | B2 | * | 7/2007  | Lee       | F28F 3/02       |
|           |    |   |         |           | 165/185         |
| 7,365,987 | B2 | * | 4/2008  | Jeong     | H05K 5/02       |
|           |    |   |         |           | 361/719         |

(Continued)

FOREIGN PATENT DOCUMENTS

KR    10-2005-0041067 A    5/2005
KR    10-2010-0037421 A    4/2010

(Continued)

*Primary Examiner* — Robert J Hoffberg (57) ABSTRACT

Disclosed is a heat dissipation module assembly comprising: a base disposed adjacent to a heating unit and a heat dissipation module including one or more heat dissipation fins, the heat dissipation fin having an inlet portion and an outlet portion formed on both sides thereof and a hollow flow channel communicating with the inlet portion and the outlet portion, wherein the one or more heat dissipation fins being stacked to emit heat through the outlet portion, the heat being generated from the heating unit and absorbed by air flowed in through the inlet portion.

17 Claims, 10 Drawing Sheets

(56) References Cited

U.S. PATENT DOCUMENTS

| | | | | |
|---|---|---|---|---|
| 7,492,599 B1* | 2/2009 | Yu | ............................ | F21K 9/00 |
| | | | | 165/185 |
| 7,535,716 B2* | 5/2009 | Fischer | .................... | H04Q 1/10 |
| | | | | 165/80.3 |
| 7,946,336 B2* | 5/2011 | Wang | .................... | H01L 23/467 |
| | | | | 165/80.2 |
| 8,837,140 B2* | 9/2014 | Zurowski | ........... | H05K 7/20154 |
| | | | | 361/679.49 |
| 9,134,077 B2* | 9/2015 | Tang | ........................ | H01L 23/40 |
| 9,161,478 B2* | 10/2015 | Pierides | .................. | B23P 15/26 |
| 9,220,185 B2* | 12/2015 | Ritter | ...................... | H01L 23/36 |
| 2007/0230118 A1* | 10/2007 | Leija | .................. | H05K 7/20718 |
| | | | | 361/690 |
| 2009/0116186 A1* | 5/2009 | Wei | ........................ | F28D 1/0477 |
| | | | | 361/690 |
| 2010/0006261 A1* | 1/2010 | Ishida | ..................... | B61C 17/00 |
| | | | | 165/86 |
| 2013/0063895 A1 | 3/2013 | Ritter et al. | | |
| 2015/0139662 A1* | 5/2015 | Keil | .................... | G02B 6/4269 |
| | | | | 398/139 |

FOREIGN PATENT DOCUMENTS

| | | |
|---|---|---|
| KR | 10-2013-0077841 A | 7/2013 |
| KR | 10-2015-0052933 A | 5/2015 |

* cited by examiner

HEAT DISSIPATION MODULE ASSEMBLY AND SET-TOP BOX HAVING THE SAME

CROSS-REFERENCE TO RELATED APPLICATION

This application is based on and claims the benefit of priority to Korean Patent Application No. 10-2016-0042384, filed on Apr. 6, 2016 in the Korean Intellectual Property Office, the disclosure of which is incorporated herein in its entirety by reference.

BACKGROUND OF THE INVENTION

Field of the Invention

The present disclosure relates to a heat dissipation module assembly and a set-top box (STB) having the same and, more particularly, to a heat dissipation module assembly dissipating heat generated by a heating unit such as an electronic component, and an STB having the same.

Related Art

Technologies in the broadcast and communication fields have been developed on the basis of various types of contents provided to viewers who consume contents through display devices such as TVs. Such contents are transmitted to viewers through various transmission mediums such as terrestrial, satellite, and cable broadcasting as well as networks.

Here, a viewer needs a STB to enjoy contents through the various transmission mediums as mentioned above. The viewers generally use various STBs including a terrestrial STB for receiving terrestrial broadcasting, a satellite STB receiving satellite broadcasting, a cable STB receiving cable broadcasting and an IPTV STB receiving IPTV broadcasting using an IP (Internet Protocol).

The STB includes a plurality of electronic components in order to receive contents from a transmission medium and provide the received contents to a viewer. For example, the plurality of electronic components include various electronic parts or components such as a broadcast receiving module receiving the contents from a transmission medium and an RF modulator. An operation of an STB inevitably accompanies heat generated from the plurality of electronic components, thereby causing degradation in performance. Thus, an STB requires a heat dissipation unit such as a heat dissipation fan or a similar device capable of dissipating heat generated from the plurality of electronic components.

As a size and a volume of the STB have constantly decreased, a size of a heat dissipation unit needs to be decreased accordingly. That is, such a decrease in a size and a volume of an STB makes it harder for a manufacturer to use an ordinary heat dissipation unit. Thus, there is a growing necessity for an effective heat dissipation unit which can be used in a smaller electronic device including a STB.

SUMMARY

Aspects of the present disclosure provide a heat dissipation module assembly enhancing heat dissipation performance according to a decrease in a size and a volume of a set-top box (STB).

In an aspect, a heat dissipation module assembly for dissipating heat generated by a heating unit such as an electronic component is provided. The heat dissipation module assembly includes a base disposed on or adjacent to a heating unit and a heat dissipation module has one or more heat dissipation fins. The heat dissipation fins have an inlet portion and an outlet portion and a hollow flow channel communicating with the inlet portion and the outlet portion. The heat dissipating module formed by stacking one or more heat dissipation fins emit heat and heat-exchanged air through the outlet portion. Heat generated by a heating unit may be dissipated without using a heat dissipation fan and a size and a volume of a set top box may be reduced.

The outlet portion is disposed with a difference in height upwards with respect to the inlet portion and the disposition with the difference in height between the inlet portion and the outlet portion induce air to rise and flow toward the outlet portion as air flowed in through the inlet portion is heat-exchanged with the heating unit.

An inner wall of the heat dissipation fin may be sloped toward the outlet portion to reduce flow resistance of air heat-exchanged with the heating unit. A partition may be disposed on the inlet portion to prevent the heat-exchanged air from flowing back to the inlet portion. A cross-sectional area of the inlet portion for air inflow may be smaller than a cross-sectional area of the outlet portion for the emission of the heat-exchanged air. The heat dissipation module may be formed by stacking one or more heat dissipation fins in parallel to a plate surface of the base.

The heat dissipation module assembly may further include a plate disposed between the base and the heat dissipation module. The dissipation module and the base can be coupled together to a protrusion and a coupling portion. The protrusion and the coupling portion may be formed in plurality in a circumference direction, and the heat dissipation module may be coupled at a predetermined rotation angle with respect to the base.

In another aspect, a set-top box includes a main body, an electronic component disposed within the main body and configured to provide contents received from a content provider to a display device, and a heat dissipation module assembly configured to dissipate heat.

BRIEF DESCRIPTION OF THE DRAWINGS

The aspects, advantages and features of the present disclosure will become more apparent from the following detailed description in conjunction with the accompanying drawings, in which.

DETAILED DESCRIPTION

Hereinafter, a heat dissipation module assembly and a set-top box (STB) having the same according to embodiments of the present disclosure will be described in detail with reference to the accompanying drawings.

While it is illustrated that one heat dissipation module assembly is used in an STB according to embodiments of the present disclosure, the number of the heat dissipation module assembly is not limited and a plurality of heat dissipation module assemblies may be used in the STB.

Also, it is illustrated that the STB according to embodiments of the present disclosure is disposed in parallel to an installation surface, but the STB can be disposed in perpendicular to the installation surface.

Figure 1:
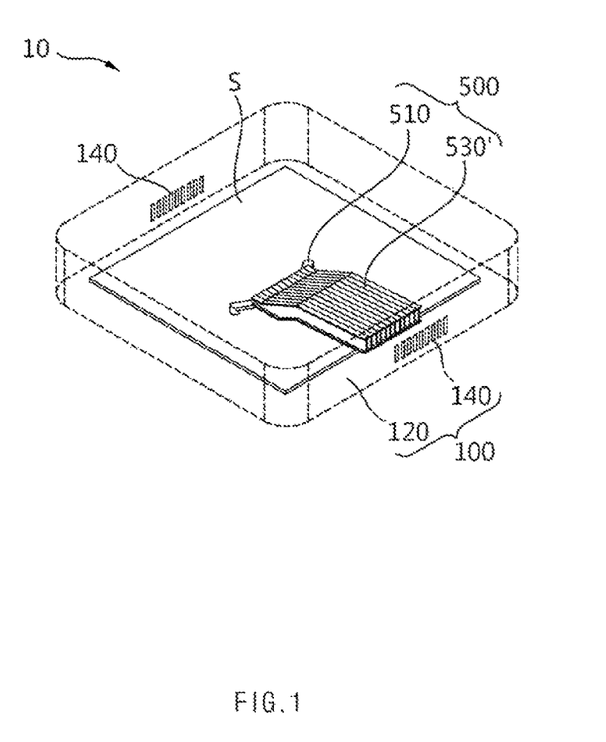
FIG. 1 is a perspective view of a set-top box (STB) according to a first embodiment of the present disclosure.

In addition, the STB illustrated in FIG. 1 may be applied to other embodiments. The same reference numbers are used for the same components in the embodiments of the present disclosure.

First and Second Embodiments

Figure 2:
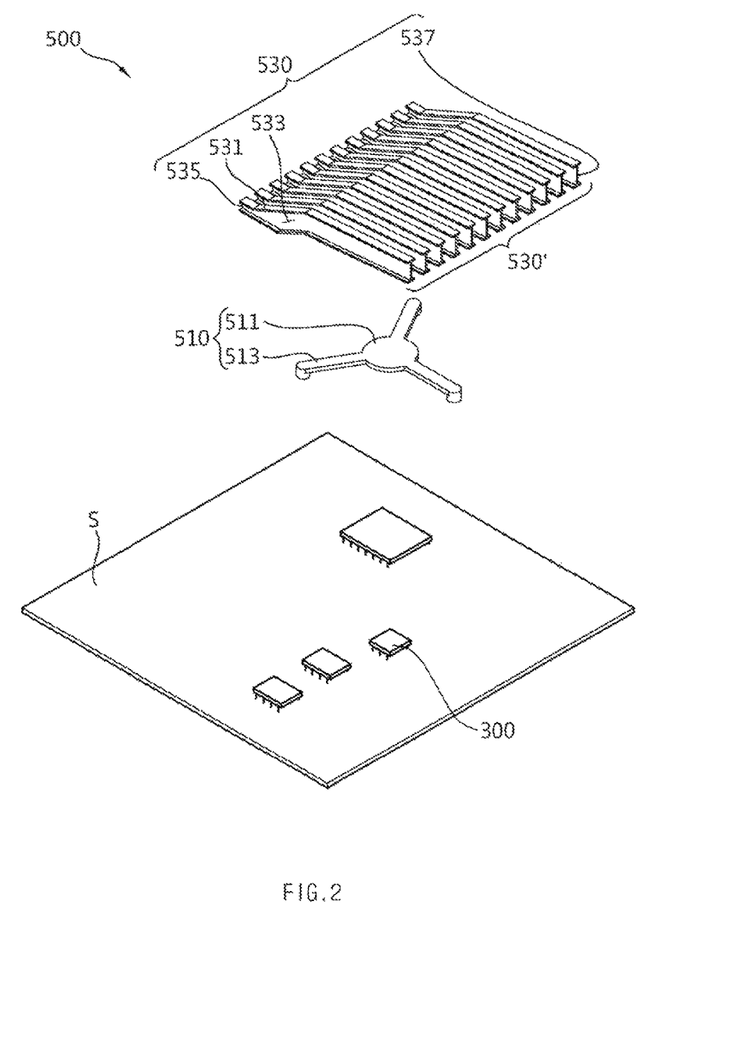
FIG. 2 is an exploded perspective view of a heat dissipation module assembly illustrated in FIG. 1.
Figure 3:
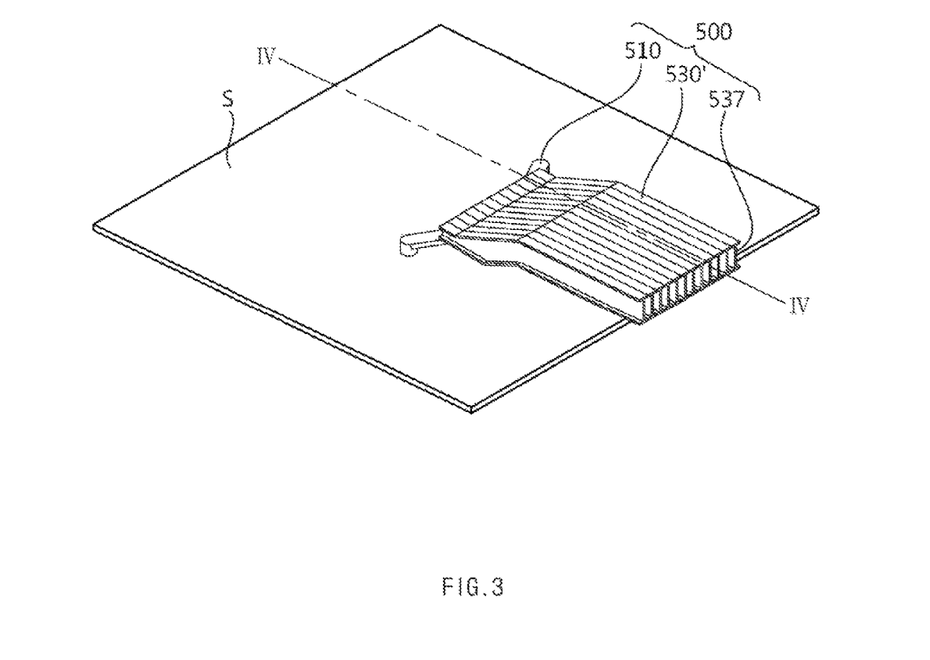
FIG. 3 is a perspective view of the heat dissipation module assembly illustrated in FIG. 2.
Figure 4:
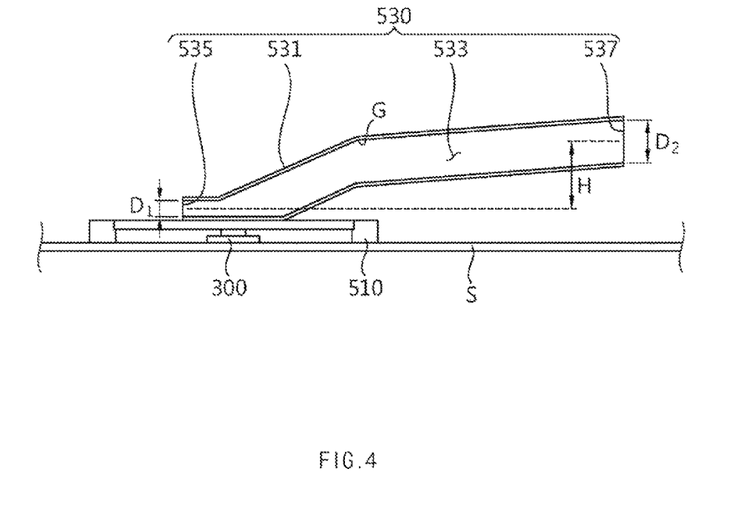
FIG. 4 is a cross-sectional view taken along line IV-IV of FIG. 3.

FIG. 1 is a perspective view of a set-top box (STB) according to a first embodiment of the present disclosure, FIG. 2 is an exploded perspective view of a heat dissipation module assembly illustrated in FIG. 1, FIG. 3 is a perspective view of the heat dissipation module assembly illustrated in FIG. 2, and FIG. 4 is a cross-sectional view taken along line IV-IV of FIG. 3.

As illustrated in FIGS. 1 through 4, an STB 10 according to a first embodiment of the present disclosure includes a main body 100, an electronic component 300, and a heat dissipation module assembly 500. The STB 10 according to the first embodiment of the present disclosure receives terrestrial broadcasting, cable broadcasting, satellite broadcasting, IPTV and/or digital broadcasting, and provides received contents to a display device (not shown).

The main body 100 may form an external appearance of the STB 10 and accommodate the electronic component 300 and the heat dissipation module assembly 500. In an embodiment of the present disclosure, the main body 100 includes a housing 120 accommodating the electronic component 300, the heat dissipation module assembly 500 and an entrance/exit portion 140 through which air comes in and out of the housing 120. Here, the entrance/exit portion 140 functions to allow air to flow into the housing 120 and emit air heat-exchanged by the heat dissipation module assembly 500. The entrance/exit portion 140 may be formed corresponding to an inlet portion 535 and an outlet portion 537 (to be described below) of the heat dissipation module assembly 500 disposed within the housing 120.

The electronic component 300 is disposed on a board S, receives contents provided from a content provider, modulates the received contents, and provides the modulated contents to a display device. The electronic component 300 includes but not limited to a content receiving module, a modulation module, and the like. The electronic component 300 generates a large amount of heat as it operates to receive contents from a content provider and provides contents to a display device.

The heat dissipation module assembly 500 includes a base 510 and a heat dissipation module 530'. The heat dissipation module assembly 500 dissipates heat generated from the electronic component 300. The heat dissipation module assembly 500 may be made of various metals such as aluminum with a high heat conductivity, or may be formed of various materials with a high heat conductivity other than metals.

The base 510 is disposed between the electronic component 300 and the heat dissipation module 530'. The base 510 is disposed above or adjacent to the electronic component 300 or disposed on or in contact with the electronic component 300. In an embodiment of the present disclosure, the base 510 includes a central portion 511 with a circular shape supporting the heat dissipation module 530' and support legs 513 extending from the central portion 511 at an interval of a 120-degree angle. The shape of the base 510 and the central portion 511 may be modified in design without being limited to the embodiment disclosed in FIGS. 2, 6 and 8.

The heat dissipation module 530' is coupled to the central portion 511 of the base 510 and dissipates heat from the electronic component 300. The heat dissipation module 530' transfers the heat generated by the electronic component 300 to flowed-in air and dissipates the heat while emitting the heat-exchanged air. In an embodiment of the present disclosure, the heat dissipation module 530' includes one or more heat dissipation fins 530. Here, a plurality of heat dissipation fins 530 are coupled to one another to form the heat dissipation module 530'.

The heat dissipation fin 530 includes a body 531. The inlet portion 535 and an outlet portion 537 formed on both sides of the body 531. The heat dissipation fin 530 includes a hollow flow channel 533 communicating with the inlet portion 535 and the outlet portion 537. As mentioned above, a plurality of heat dissipation fins 530 can be stacked and/or coupled to one another to form the heat dissipation module 530'. Here, the plurality of heat dissipation fins 530 are stacked one another in parallel to the plate surface of the base 510 to form the heat dissipation module 530'.

The inlet portion 535 and the outlet portion 537 may be disposed corresponding to the entrance/exit portion 140 formed in the housing 120. That is, the inlet portion 535 allows air coming in through the entrance/exit portion 140 to flow into the housing 120, and the outlet portion 537 is disposed within the housing 120 to emit the air heat-exchanged with the electronic component 300 to outside of the housing 120 through the entrance/exit portion 140. In an embodiment of the present disclosure, at least one inlet portion 535 is formed and the outlet portion 537 is formed corresponding to the number of the inlet portions 535. However, the number of the inlet portions 535 and the outlet portions 537 may differ according to a change in design. For example, one inlet portion 535 and two outlet portions 537 may be formed on one heat dissipation fin 530. That is, the number of the inlet portions 535 and the outlet portions 537 may be variously modified.

The inlet portion 535 may be disposed adjacent to the base 510, and the outlet portion 537 may be disposed above the inlet portion 535 with a height of H upwards. The disposition with a difference in height of H between the inlet portion 535 and the outlet portion 537 induces air which came in through the inlet portion 535 and was heat-exchanged with the electronic component 300 to rise and flow toward the outlet portion 537. That is, the air heat-exchanged with the electronic component 300 naturally rises as the temperature of the heat-exchanged air becomes higher compared to the temperature of the air flowed into the inlet portion 535. Thus, more effective heat dissipation can be achieved when the outlet portion 537 is formed higher than the inlet portion 535 with a height of H upwards.

In addition, an inner wall of the heat dissipation fin 530 is sloped (G) toward the outlet portion 537 so that it reduces flow resistance of air heat-exchanged with the electronic component 300 when the heat-exchanged air flows from the inlet portion 535 through the outlet portion 537. Here, the gradient (G) of the inner wall of the heat dissipation fin 530 may be formed in a position horizontal to the surface on which the electronic component 300 is disposed. That is, as the air heat-exchanged with the electronic component 300 rises, the gradient G in the heat dissipation fin 530 is formed in an area where the heat-exchanged air rises and collides with in order to reduce flow resistance. Since the gradient G on the inner wall of the heat dissipation fin 530 reduces flow resistance of the air, the air is effectively emitted through the outlet portion 537 and the heat dissipation performance is improved.

Also, a cross-sectional area D2 of the outlet portion 537 is greater than a cross-sectional area D1 of the inlet portion 535. In detail, the cross-sectional area D1 of the inlet portion 535 through which air flows in is smaller than the cross-sectional area D2 of the outlet portion 537 through which air heat-exchanged with the electronic component 300 is emitted. Thus, since the cross-sectional area D1 of the inlet portion 535 is smaller than the cross-sectional area D2 of the outlet portion 537, a velocity of airflow through the inlet portion 535 is faster than that of air emitted through the outlet portion 537. This makes the flow of air faster and increases a time during which the air stays in the hollow flow channel 533 of the heat dissipation fin 530.

Figure 5:
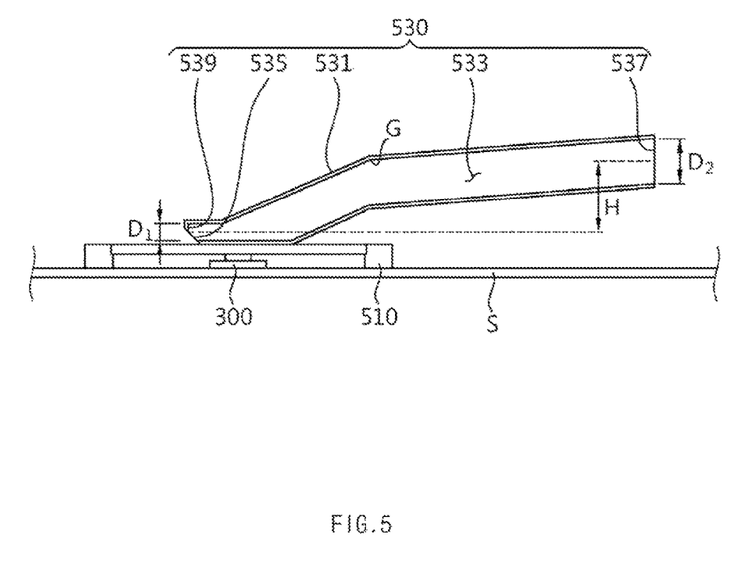
FIG. 5 is a cross-sectional view of a heat dissipation module assembly according to a second embodiment of the present disclosure.

FIG. 5 is a cross-sectional view of a heat dissipation module assembly according to a second embodiment of the present disclosure.

As illustrated in FIG. 5, a heat dissipation module assembly 500 according to the second embodiment includes all the components of the heat dissipation module assembly 500 described in the first embodiment and further includes a partition 539.

The partition 539 extends from one side of the inlet portion 535 to prevent air heat-exchanged with the electronic component 300 from flowing back to the inlet portion 535. The size of the partition 539 may be modified in accordance with design and necessity so that it can enhance both air inflow efficiency and air backflow prevention efficiency. Here, the partition 539 is formed in a size covering the inlet portion 535 at a minimum ratio of the cross-sectional area D1.

Third Embodiment

Figure 6:
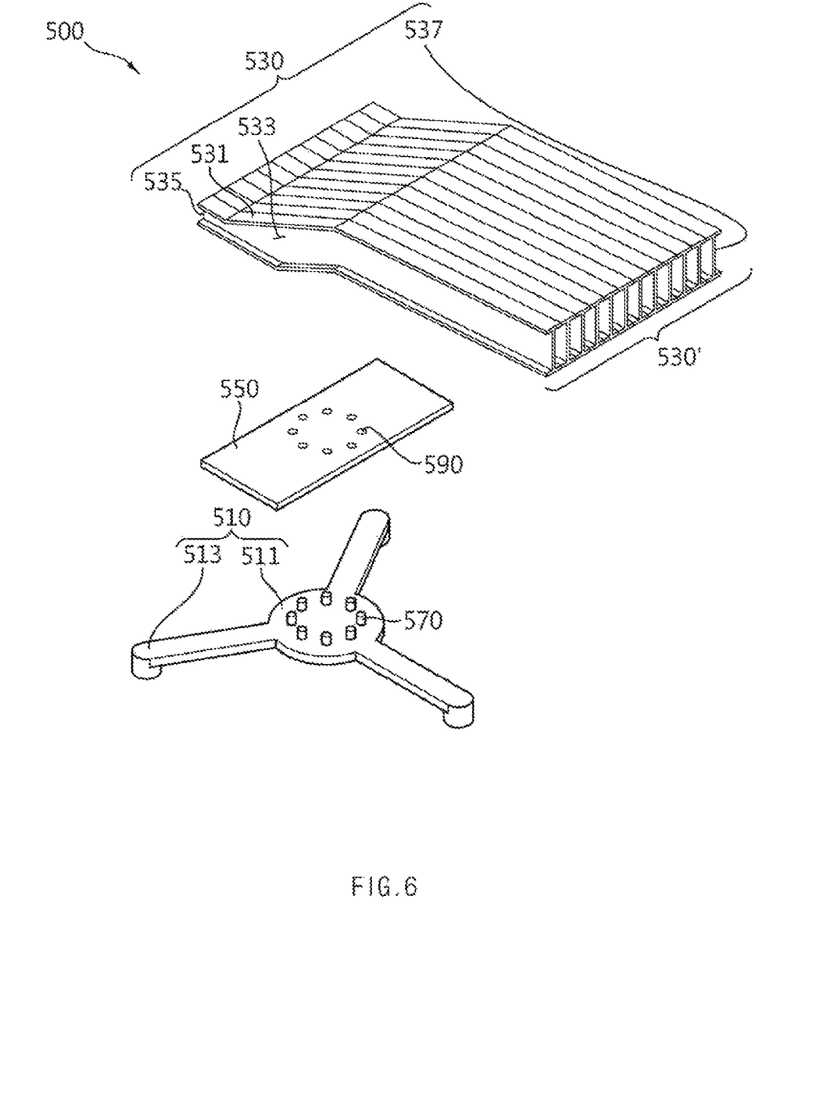
FIG. 6 is an exploded perspective view of a heat dissipation module assembly according to a third embodiment of the present disclosure.
Figure 7:
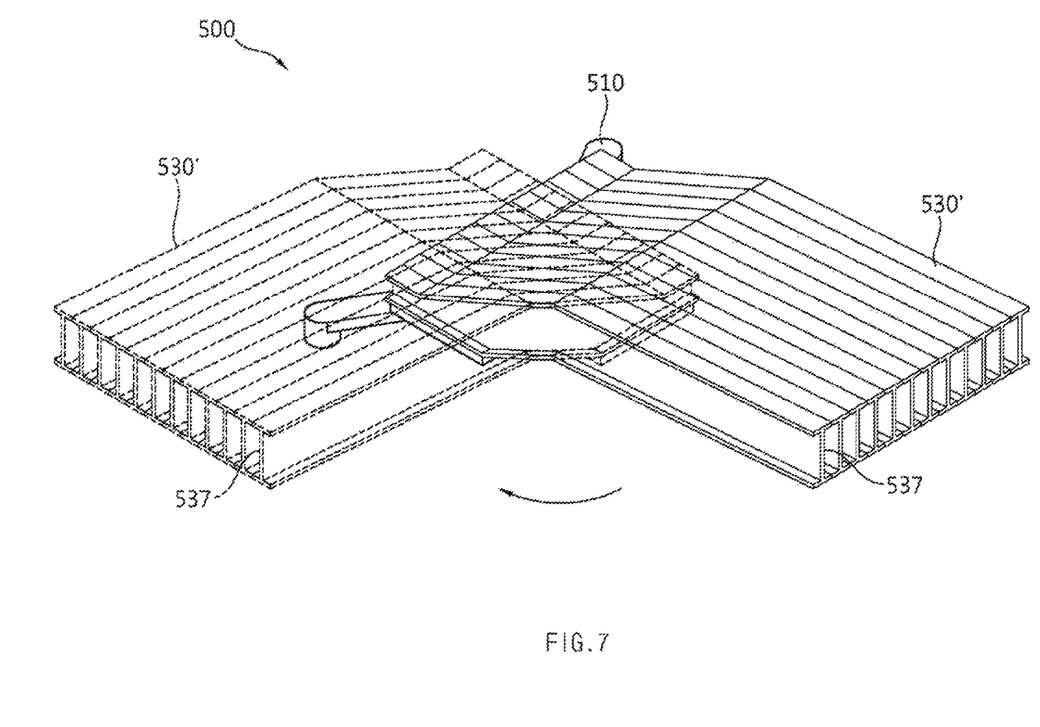
FIG. 7 is an operational perspective view of a heat dissipation module assembly according to the third embodiment of the present disclosure.

FIG. 6 is an exploded perspective view of a heat dissipation module assembly according to a third embodiment of the present disclosure, and FIG. 7 is an operational perspective view of a heat dissipation module assembly according to the third embodiment of the present disclosure.

As illustrated in FIGS. 6 and 7, a heat dissipation module assembly 500 of an STB 10 according to the third embodiment of the present disclosure includes a base 510, a heat dissipation module 530', a plate 550, a protrusion 570, and a coupling portion 590. Since the base 510 and the heat dissipation module 530' are the same as the base 510 and the heat dissipation module 530' described above in the first and second embodiments, a detailed description thereof will be omitted.

The plate 550 is coupled to the heat dissipation module 530' and disposed between the base 510 and the heat dissipation module 530'. The plate 550 is provided such that the heat dissipation module 530' is rotated and disposed at a predetermined angle with respect to the base 510.

For the protrusion 570 and the coupling portion 590 to be coupled, the protrusion 570 may be disposed on either the base 510 or the plate 550 and the coupling portion 590 may be disposed on either the base 510 or the plate 550. In an embodiment of the present disclosure, the protrusion 570 is disposed on the base 510, and the coupling portion 590 is disposed on the plate 550. However, the place where the protrusion 570 and the coupling portion 590 are disposed may be replaced each other, respectively.

The protrusion 570 and the coupling portion 590 are formed in plurality in a circumference direction. As illustrated in FIG. 7, the heat dissipation module 530' is coupled at a predetermined rotation angle to the base 510 in the circumference direction so that the directions of the inlet portion 535 and the outlet portion 537 can be adjusted. Since the plurality of protrusions 570 and the plurality of coupling portions 590 are formed in the circumference direction, the directions of the inlet portion 535 and the outlet portion 537 can be aligned with the entrance/exit portion 140 by rotating the heat dissipation module 530' with respect to the base 510.

Fourth Embodiment

Figure 8:
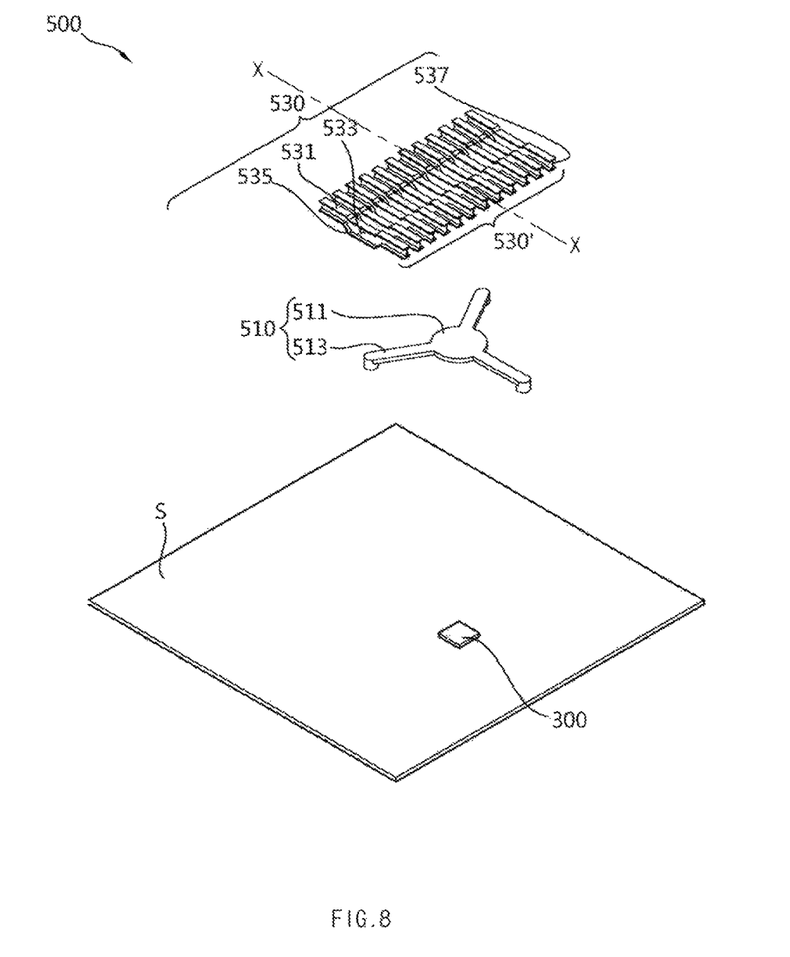
FIG. 8 is an exploded perspective view of a heat dissipation module assembly according to a fourth embodiment of the present disclosure.
Figure 9:
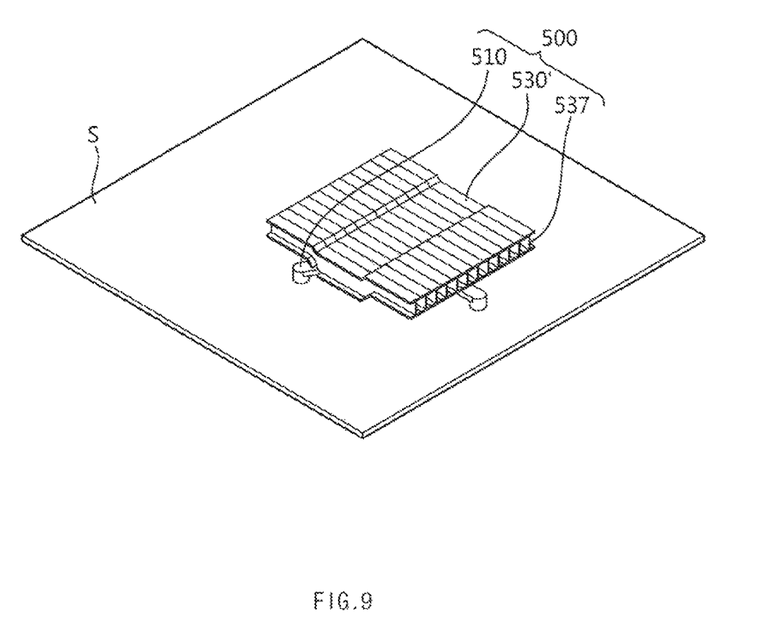
FIG. 9 is a perspective view of a heat dissipation module assembly illustrated in FIG. 8.
Figure 10:
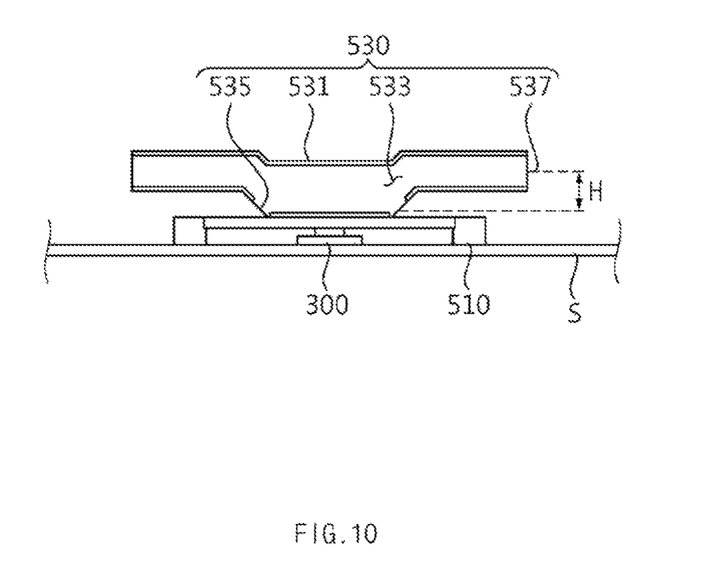
FIG. 10 is a cross-sectional view taken along line X-X of FIG. 8.

FIG. 8 is an exploded perspective view of a heat dissipation module assembly according to a fourth embodiment of the present disclosure. FIG. 9 is a perspective view of a heat dissipation module assembly illustrated in FIG. 8. FIG. 10 is a cross-sectional view taken along line X-X of FIG. 8.

As illustrated in FIGS. 8 through 10, a heat dissipation module assembly 500 according to the fourth embodiment of the present disclosure includes a base 510 and a heat dissipation module 530'. Here, the heat dissipation module assembly 500 according to the fourth embodiment of the present disclosure includes an inlet portion 535, an outlet portion 537, and a hollow flow channel 533 as described in the first embodiment of the present disclosure. However, unlike the first embodiment, two inlet portions 535 and two outlet portions 537 are formed in one heat dissipation fin 530 in the heat dissipation module assembly 500 according to the fourth embodiment of the present disclosure. That is, as illustrated in FIGS. 8 through 10, the two inlet portions 535 are formed in a different or opposite direction adjacent to the base 510, and the two outlet portions 537 are formed in a different or opposite direction with a height of H upwards with respect to the inlet portion 535.

The partition 539 of the second embodiment as well as the plate 550, the protrusion 570 and the coupling portion 590 of the third embodiment may be applied respectively or together to the heat dissipation module assembly 500 described in the fourth embodiment of the present disclosure.

Thus, heat generated by a heating unit may be dissipated without a heat dissipation fan according to a natural convection scheme using the inlet portion and the outlet portion. Moreover, the omission of a heat dissipation fan may reduce a size and a volume of the STB and enhance heat dissipation performance based on the natural convection scheme.

Since a plurality of heat dissipation fins are stacked to form a heat dissipation module, a size of the heat dissipation module may be adjustable corresponding to a size of a heating unit and improve the usability of the electronic device including the STB.

In addition, since the base 510 and the heat dissipation module 530' are disposed at a predetermined rotation angle in a circumference direction, the directions of the inlet portion 535 and the outlet portion 537 can be adjusted toward the entrance/exit portion allowing air to flow in and out of the STB. The heat dissipation module described herein may be used to various types of STBs without an additional component.

As used in the description of the preferred embodiments and the claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The term "coupled" may be used to refer to any type of relationship, direct or indirect, between the components in question, and may apply to electrical, mechanical, fluid, optical, electromagnetic, electromechanical or other connections. The descriptions of the various embodiments of the present disclosure have been presented for the purpose of illustration. The illustrative discussions above are not intended to be exhaustive or limited to the embodiments disclosed. Many modifications and variations will be apparent to those of ordinary skill in the art in view of the above teachings without departing from the scope and spirit of the invention. The terminology or implementations described herein were chosen in order to best explain the principles of the embodiments and their practical applications, or to enable others skilled in the art to understand the embodiments disclosed herein and utilized the implementations with various modifications.

What is claimed is:

1. A heat dissipation module assembly comprising:
a base disposed adjacent to a heating unit; and
a heat dissipation module including a stack of heat dissipation fins, each adjacent pair of the heat dissipation fins forming a closed hollow flow channel, each of the closed hollow flow channel having an inlet portion disposed adjacent to the base and an outlet portion disposed distal to the base unit and having a difference in height upwards with respect to the inlet portion, the inlet portion and the outlet portion formed on respective sides of the closed hollow flow channel heat generated from the heating unit being absorbed by air flowed in through the inlet portion, the difference in the height between the inlet portion and the outlet portion induces the air to rise and flow toward the outlet portion as the air flowed in through the inlet portion is heat-exchanged with the heating unit, and the heated air being emitted out of the outlet portion.

2. The heat dissipation module assembly of claim 1, wherein an inner wall of the heat dissipation fins is sloped toward the outlet portion to reduce flow resistance of the air flowing from the inlet portion through the outlet portion, the air being heat-exchanged with the heating unit.

3. The heat dissipation module assembly of claim 1, wherein a partition is disposed at the inlet portion to prevent the air heat-exchanged with the heating unit from flowing back to the inlet portion.

4. The heat dissipation module assembly of claim 3, wherein the inlet portion is a pair of inlet portions, the pair of inlet portions formed in a different or opposite direction are disposed adjacent to the base, and the outlet portion is a pair of outlet portions, the pair of outlet portions are disposed in a different or opposite direction with a difference in height upwards with respect to the pair of inlet portions.

5. The heat dissipation module assembly of claim 1, wherein a cross-sectional area of the inlet portion through which the air flows in is smaller than a cross-sectional area of the outlet portion through which the air heat-exchanged with the heating unit is emitted.

6. The heat dissipation module assembly of claim 1, wherein the heat dissipation module is formed by stacking the heat dissipation fins in parallel to a plate surface of the base.

7. The heat dissipation module assembly of claim 1, wherein the inlet portion is at least one inlet portion, the outlet portion is at least one outlet portion, and a number of the outlet portion is formed corresponding to a number of the at least one inlet portions.

8. The heat dissipation module assembly of claim 1, further comprising: a plate coupled to the heat dissipation module and disposed between the base and the heat dissipation module, wherein a protrusion is disposed on at least one of the base or the plate, and a coupling portion to be coupled to the protrusion is disposed on at least another of the base or the plate.

9. The heat dissipation module assembly of claim 8, wherein the protrusion is a plurality of protrusions and the coupling portion is a plurality of coupling portions, the protrusions and coupling portions are each formed in plurality in a circumference direction, and the heat dissipation module is coupled at a predetermined rotation angle with respect to the base such that directions of the inlet portion and the outlet portion are adjusted.

10. A set-top box comprising:
a main body;
an electronic component disposed within the main body and configured to provide contents received from a content provider to a display device; and
a heat dissipation module assembly configured to dissipate heat, wherein the heat dissipation module assembly is disposed adjacent to the electronic component and has a heat dissipation module formed by a stack of heat dissipation fins, each adjacent pair of the heat dissipation fins forming a closed hollow flow channel, each of the closed hollow flow channel having an inlet portion through which air flows in and an outlet portion through which the air heat-exchanged with the electronic component is emitted, the inlet portion and the outlet portion being disposed on respective sides of the closed hollow flow channel,
the outlet portion is disposed with a difference in height upwards with respect to the inlet portion, the difference in the height between the inlet portion and the outlet portion induces the air being heat-exchanged with the electronic component to rise and flow toward the outlet portion.

11. The set-top box of claim 10, wherein a cross-sectional area of the inlet portion through which the air flows in is smaller than a cross-sectional area of the outlet portion through which the air heat-exchanged with the electronic component is emitted.

12. The set-top box of claim 10, wherein each adjacent pair of the dissipation fins forming a closed hollow flow channel includes an inner wall which is sloped toward the outlet portion to reduce flow resistance of the air heat-exchanged with the electronic component flowing from the inlet portion to the outlet portion.

13. The set-top box of claim 10, wherein a partition is disposed on the inlet portion to prevent the air heat-exchanged with the electronic component from flowing back to the inlet portion.

14. The set-top box of claim 10, wherein the heat dissipation module assembly further comprises:

a base disposed between the electronic component and the heat dissipation module to support the heat dissipation module, wherein the heat dissipation module is formed by a stacking the heat dissipation fins in a direction parallel to a plate surface of the base.

15. The set-top box of claim 14, wherein the inlet portion is a pair of inlet portions, the pair of inlet portions formed in a different or opposite direction are disposed adjacent to the base, and the outlet portion is a pair of outlet portions, the pair of outlet portions are disposed in a different or opposite direction with a difference in height upwards with respect to the pair of inlet portions.

16. The set-top box of claim 14, wherein the heat dissipation module assembly further comprises:

a plate coupled to the heat dissipation module and disposed between the base and the heat dissipation module, wherein a protrusion is disposed on at least one of the base or the plate, and a coupling portion to be coupled to the protrusion is disposed on at least another of the base or the plate.

17. The set-top box of claim 16, wherein the protrusion is a plurality of protrusions and the coupling portion is a plurality of coupling portions, the protrusions and coupling portions are each formed in plurality in a circumference direction, and the heat dissipation module is coupled at a predetermined rotation angle with respect to the base such that directions of the inlet portion and the outlet portion are adjusted corresponding to an entrance/exit portion formed on the main body.

\* \* \* \* \*